(12) United States Patent
Nandakumar

(10) Patent No.: US 12,408,352 B2
(45) Date of Patent: Sep. 2, 2025

(54) ADVANCED POLY RESISTOR AND CMOS TRANSISTOR

(71) Applicant: Texas Instruments Incorporated, Dallas, TX (US)

(72) Inventor: Mahalingam Nandakumar, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 382 days.

(21) Appl. No.: 17/714,990

(22) Filed: Apr. 6, 2022

(65) Prior Publication Data
US 2023/0326954 A1    Oct. 12, 2023

(51) Int. Cl.
*H10D 1/47* (2025.01)
*H01L 21/265* (2006.01)
*H01L 21/268* (2006.01)

(52) U.S. Cl.
CPC ......... *H10D 1/47* (2025.01); *H01L 21/26513* (2013.01); *H01L 21/268* (2013.01)

(58) Field of Classification Search
None
See application file for complete search history.

(56) References Cited

U.S. PATENT DOCUMENTS

| 11,011,508 B2 | 5/2021 | Nandakumar et al. |
| 2013/0149849 A1 | 6/2013 | Nandakumar |
| 2016/0379830 A1* | 12/2016 | Dasgupta ............... H01L 21/268 438/585 |
| 2019/0115226 A1 | 4/2019 | Kirkpatrick et al. |

OTHER PUBLICATIONS

US 2016-0035720 A1 (Texas Instruments Incorporated), Feb. 4, 2016 (Feb. 4, 2016). paragraphs [0011]-[0037] and figures 1A-4B.
US 2002-0084492 A1 (Jun Osanai et al.) Jul. 4, 2002 (Jul. 4, 2002). paragraphs [0607]-[0614], [0847]-[0849] and figures 1-2, 12-15.
US 2015-0031179 A1 (Globalfoundries Inc.) Jan. 29, 2015 (Jan. 29, 2015). paragraphs [0026]-[0097] and figures 1-6.
US 2016-0218171 A1 (Taiwan Semiconductor Manufacturing Co., Ltd.) Jul. 28, 2016 (Jul. 28, 2016). paragraphs [0019]-[0027] and figures 1-8.
US 2011-0169089 A1 (Bruce B. Doris et al.) Jul. 14, 2011 (Jul. 14, 2011). paragraphs [0023]-[0059] and figures 1-7.
International Search Report, International application No. PCT/US2023/017397. Dated Jul. 18, 2023.

* cited by examiner

*Primary Examiner* — Alexander G Ghyka
(74) *Attorney, Agent, or Firm* — Andrew R. Ralston; Frank D. Cimino

(57) ABSTRACT

A method of forming an integrated circuit includes first forming a resistor body and a transistor gate from a semiconductor layer over a substrate. Second, sidewall spacers are formed adjacent the resistor body and the transistor gate. Third, a silicide blocking structure is formed over at least a portion of the resistor body. And fourth, the resistor body and the transistor gate are concurrently millisecond annealed.

19 Claims, 12 Drawing Sheets

ADVANCED POLY RESISTOR AND CMOS TRANSISTOR

BACKGROUND

The example embodiments relate to semiconductor integrated circuit (IC) fabrication, and more particularly to an IC manufactured with processes that concurrently form portions of IC polysilicon resistors and transistors.

IC fabrication of plural devices, such as resistors and transistors, typically involves multiple steps where often a same step can be used to concurrently form a part of each device. In some instances, however, an additional step or steps may be required for one or the other device, or a step directed entirely or primarily to one device may have countereffects as to the other device. For example, one example of a polysilicon resistor is known as a "zero temperature-coefficient of resistance" (ZTCR) resistor, which is also sometimes referred to as having zero tempco, meaning little or no variability in resistance over a certain temperature range. Some baseline ZTCR resistor manufacturing processes require additional steps, including as examples patterning, implanting (e.g., with boron), and resist removal, so as to achieve the desired ZTCR, but while adding to IC manufacture complexity and costs. Numerous other examples exist, particularly where a step or steps may be needed to form one or a set of structures, which at the same time can impact others or affect overall cost or complexity. Further, where a step is required for one device but not the other, the overall manufacturing cost is increased, as opposed to a step that concurrently forms a portion of both devices.

While the preceding has implementation in various baseline devices, this document provides example embodiments that may improve on certain of the above concepts, as detailed below.

SUMMARY

A method of forming an integrated circuit, comprising, first, forming a resistor body and a transistor gate from a semiconductor layer; second, forming sidewall spacers adjacent the resistor body and the transistor gate; third, forming a silicide blocking structure over at least a portion of the resistor body; fourth, concurrently millisecond annealing the resistor body and the transistor gate.

Another aspect provides an integrated circuit that includes a semiconductor substrate and a first polysilicon resistor positioned relative to the semiconductor substrate. The first polysilicon resistor includes a majority dopant concentration of n-type dopants and has a temperature coefficient of resistance (tempco) within a range of ±100 ppm/° C. A second polysilicon resistor is positioned relative to the semiconductor substrate, and includes a majority dopant concentration of p-type dopants and has a temperature coefficient of resistance within a range of ±100 ppm/° C.

Other aspects are also described and claimed.

DETAILED DESCRIPTION

Examples are described with reference to the attached figures. The figures are provided to illustrate the examples and may not be drawn to scale. Several aspects are described with reference to example applications for illustration, in which like features correspond to like reference numbers. Numerous specific details, relationships, and methods are set forth to provide an understanding, but the scope is not necessarily limited by the illustrated ordering of acts or events, as some acts may occur in different orders and/or concurrently with other acts or events. Further, not all illustrated acts or events may be required to implement a methodology in accordance with one or more examples.

Figure 1:
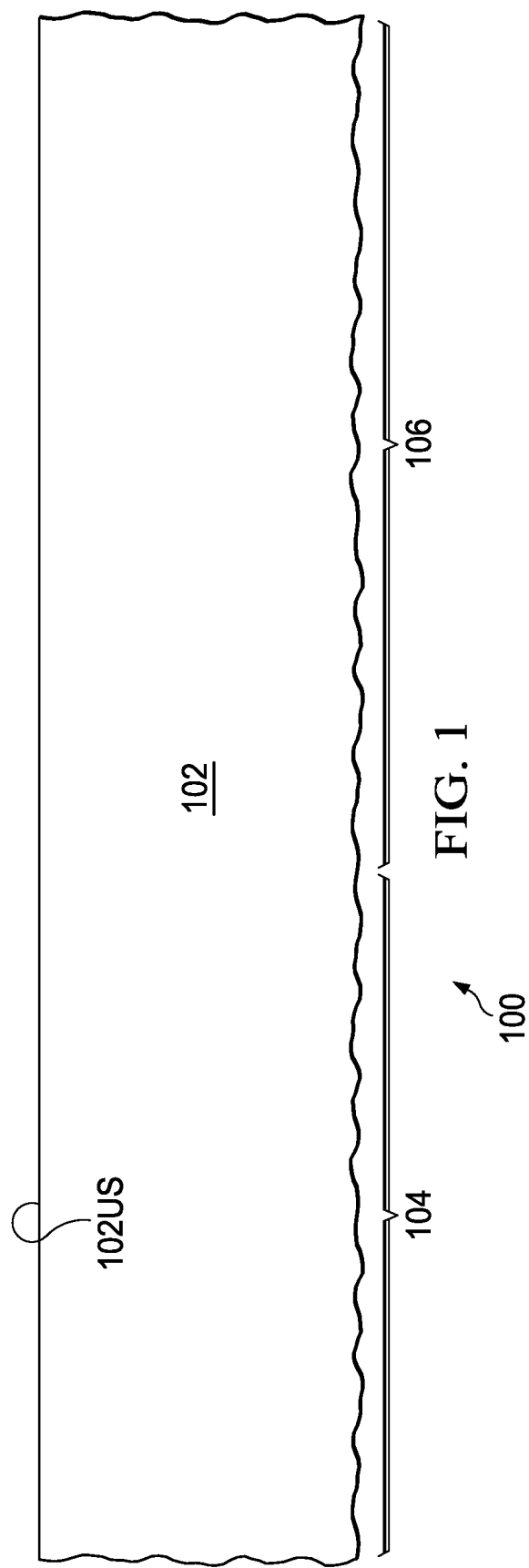
FIGS. 1 through 10 are cross-section views representing successive fabrication stages and resultant structures of a semiconductor structure.
Figure 9:
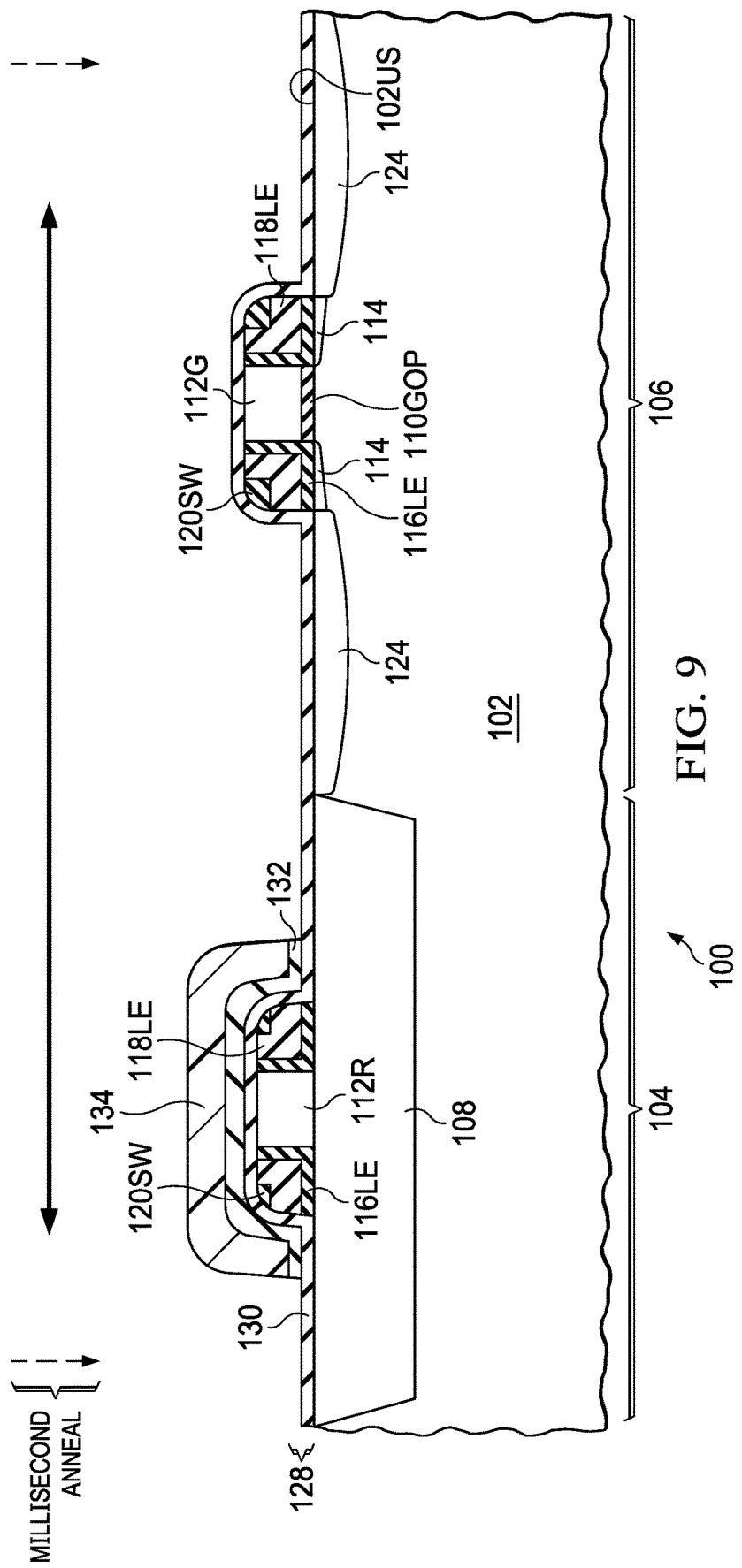
Figure 10:
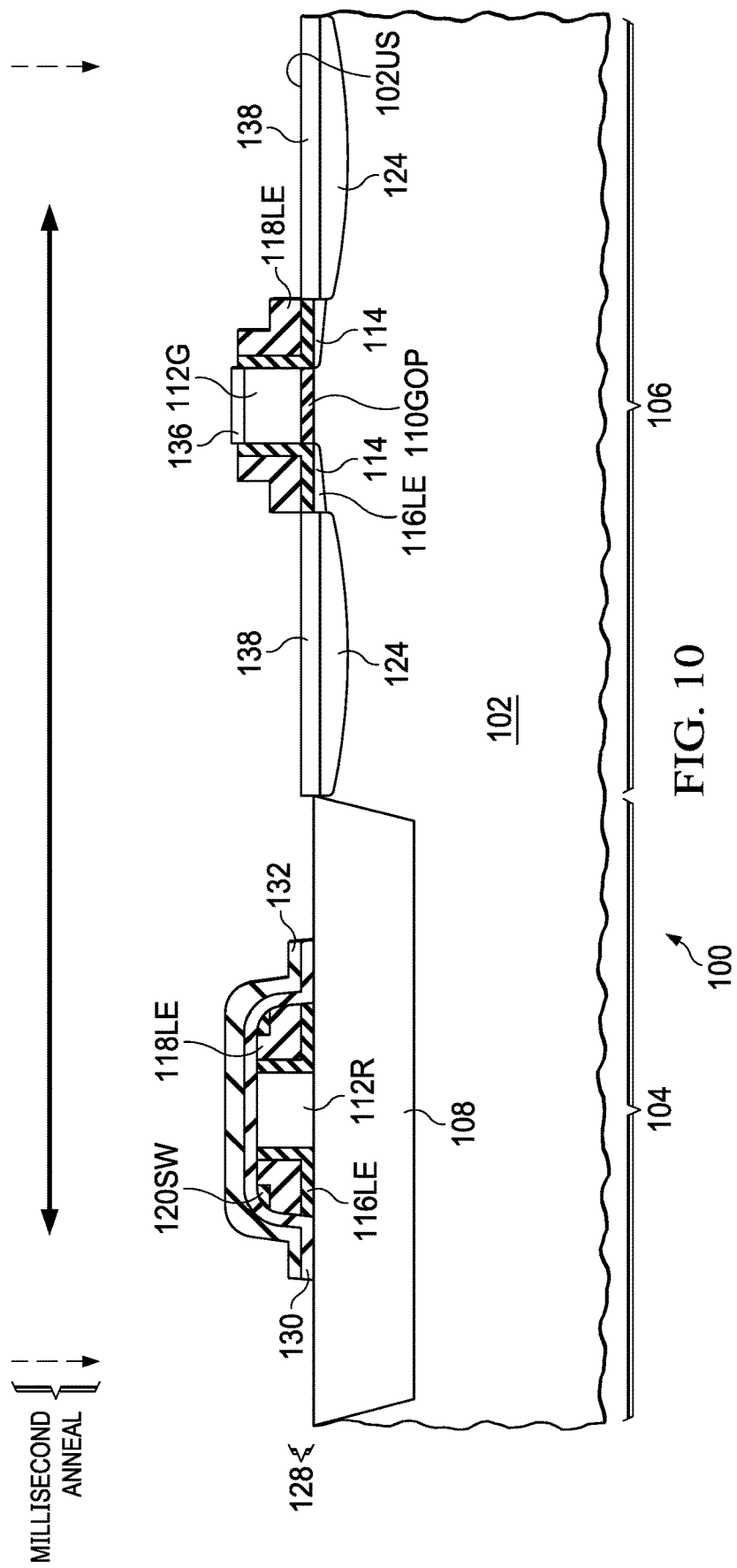
Figure 11:
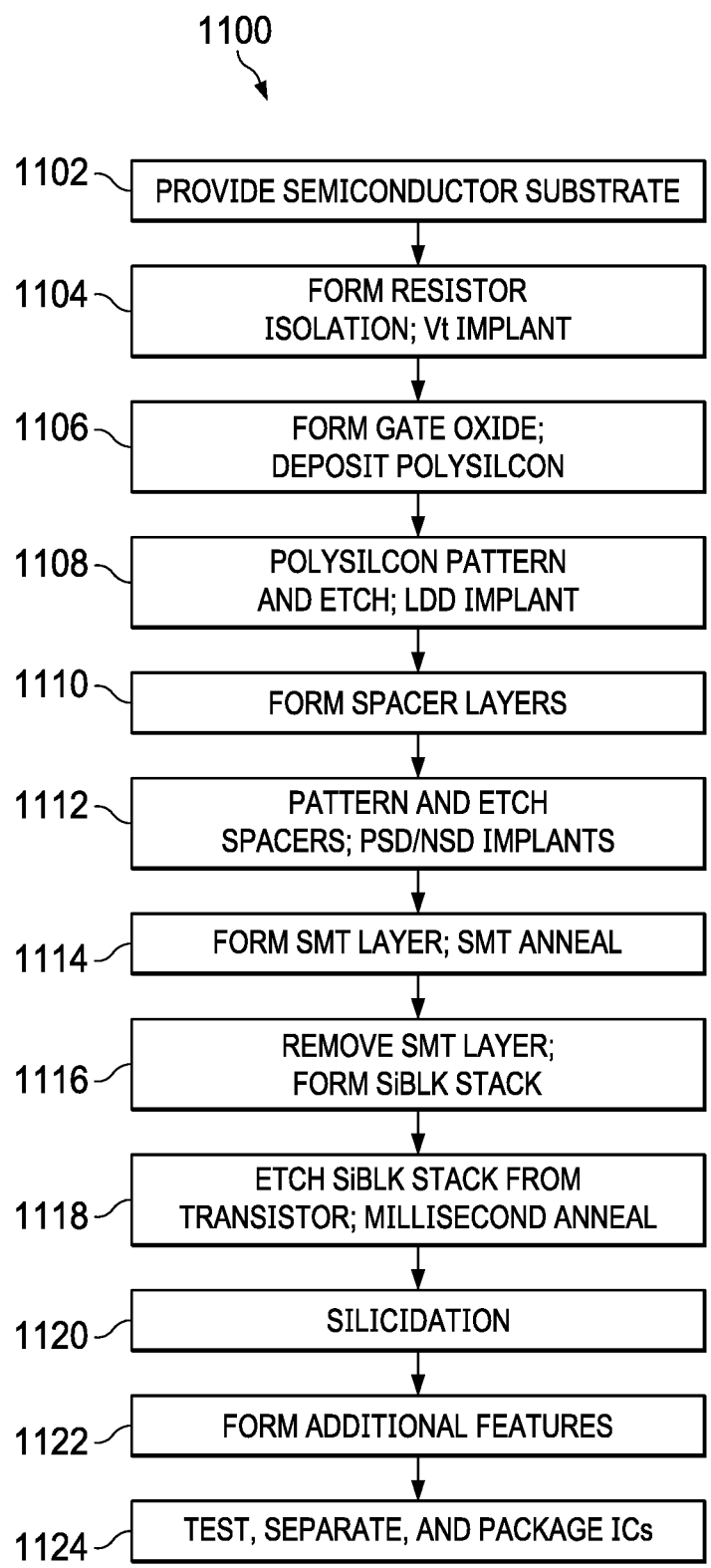
FIG. 11 is a flow diagram of an example embodiment method for manufacturing a semiconductor structure, and its steps correspond to respective ones of FIGS. 1 through 10.

FIGS. 1 through 10 are cross-section views representing successive fabrication stages and resultant structures of a semiconductor structure 100, and FIG. 11 is a method 1100, in flow chart form, that summarizes steps of those fabrication stages. In FIG. 1 (and method step 1102) a semiconductor structure 100 is provided at an early manufacturing stage. The semiconductor structure 100 includes a semiconductor substrate 102, for example as part of a silicon wafer. Such a wafer typically includes multiple locations, each corresponding to a same or different IC on the wafer, so the illustration of FIG. 1 (and later figures) can be repeated in each wafer IC location. The wafer typically provides either a p-type or n-type semiconductor, and the semiconductor substrate 102 can represent a portion of the bulk wafer or a region (e.g., a well or buried layer) formed in connection with the wafer. As detailed in the remaining figures, a resistor 104 and a transistor 106 are ultimately formed in connection with the semiconductor substrate 102, and those devices are represented only by general corresponding areas in FIG. 1. Ultimately, these figures, and the corresponding descriptions, provide an efficient, cost-sensitive formation of each of the resistor 104 and the transistor 106, for example including favorable low resistance in the resistor 104, the absence of a separate ZTCR mask and implant, the availability of ZTCR performance in the resistor 104 (along with options for different sizes and dopant types), and implementing the transistor 106 without diminishing (or by reactivating) its dopant activation or performance.

Figure 2:
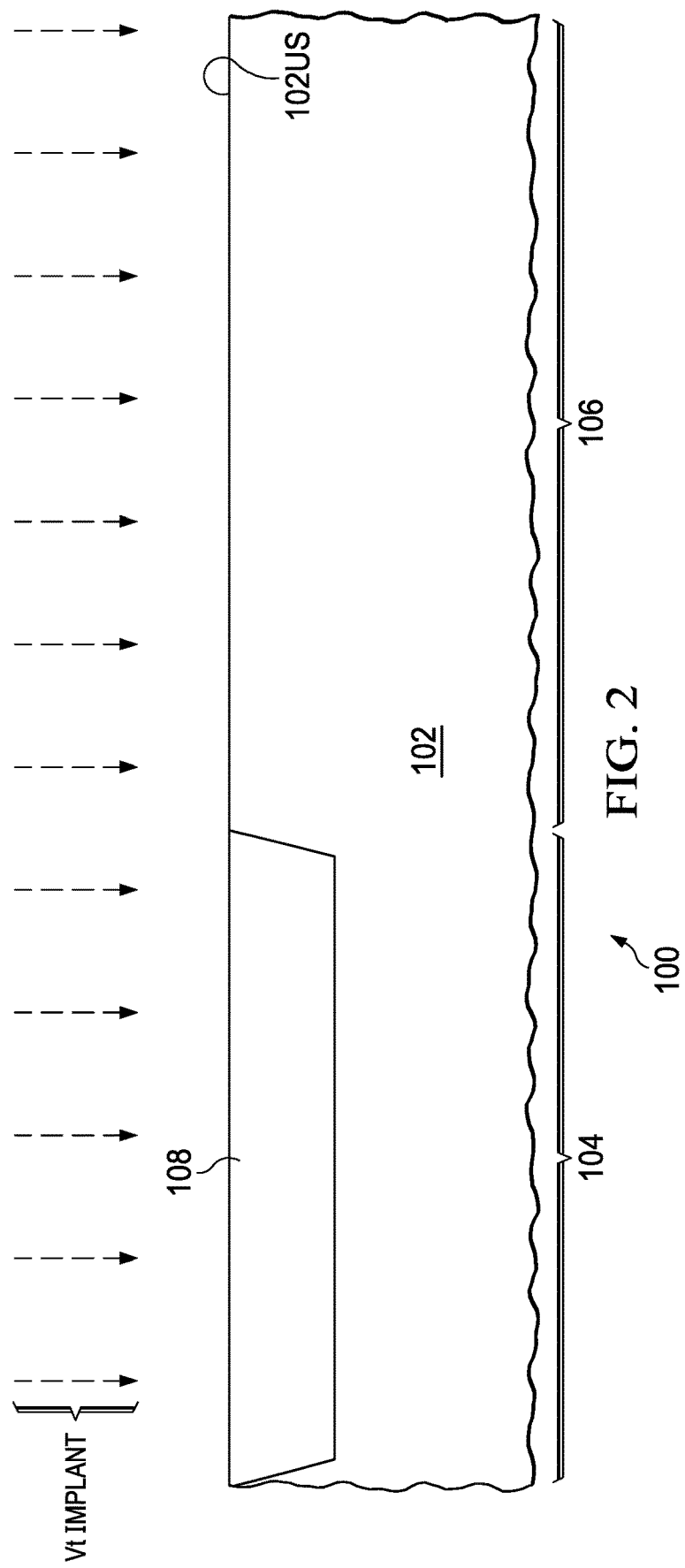

In FIG. 2 (and FIG. 11 method step 1104), a surface isolation structure 108, for example a shallow trench isolation (STI), is formed in a portion of an upper surface 102US of the semiconductor substrate 102, corresponding to the area of the resistor 104. The surface isolation structure 108 is shown for example as a shallow trench isolation (STI) structure having a thickness in a range of 150 nm to 600 nm, and it may later conductively isolate the resistor 104 from the substrate 102. Alternative isolation methods also may be used, such as a different insulator, a local oxidation of silicon (LOCOS) structure or a doped well region. Thereafter, a threshold voltage (Vt) implant is applied to the semiconductor substrate 102, with dopant type and energy selected to ultimately adjust the Vt of the transistor 106, for example providing an average dopant concentration from $1e16/cm^3$ to $1e18/cm^3$. Meanwhile, the surface isolation structure 108 essentially blocks the implant dopants from having an effect in the substrate 102, in the area of the resistor 104.

Figure 3:
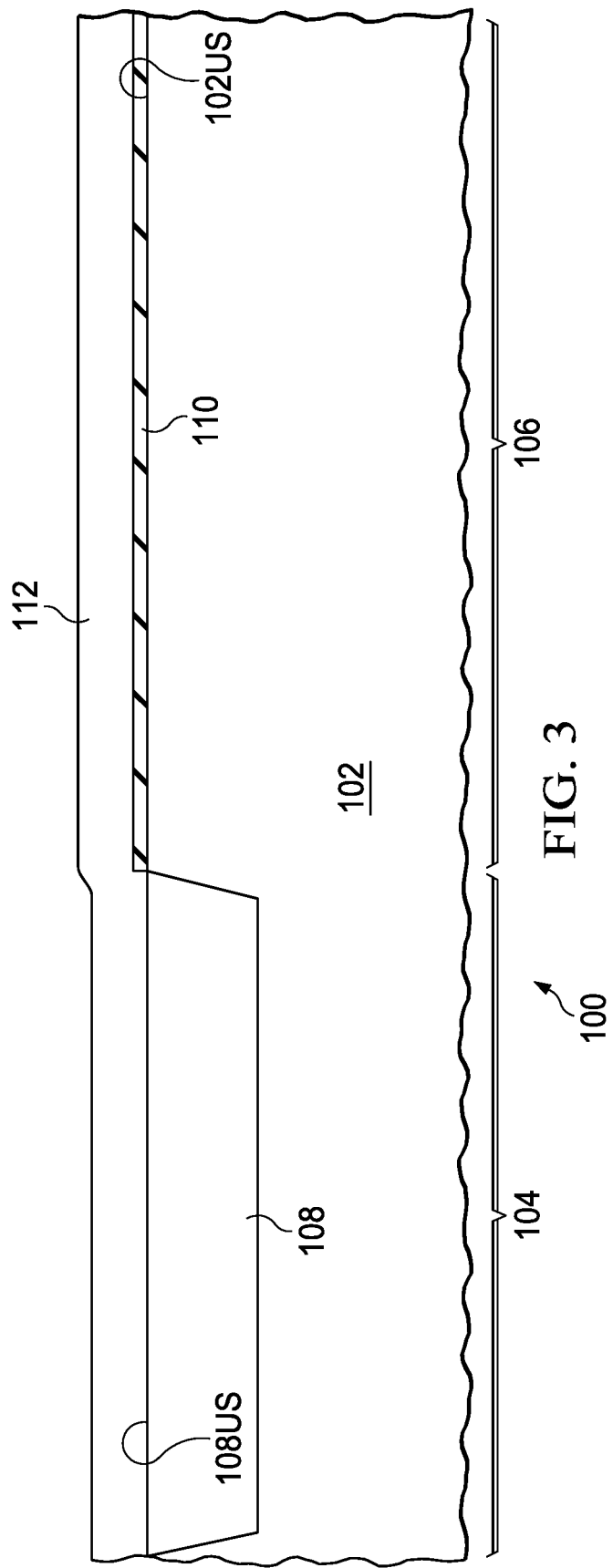

In FIG. 3 (and FIG. 11 method step 1106), a gate oxide layer 110 is formed across a portion of the upper surface 102US, for example where the surface isolation structure 108 is not located and by oxidizing the remaining exposed portion of the upper surface 102US. The gate oxide layer 110 may have a thickness from 1 nm to 5 nm. Thereafter, a polysilicon layer 112 is deposited atop the entire illustrated structure, thereby conforming to the gate oxide layer 110 and an upper surface 108US of the surface isolation structure 108. The polysilicon layer 112 is typically undoped when deposited, although may be in situ doped in some examples.

Figure 4:
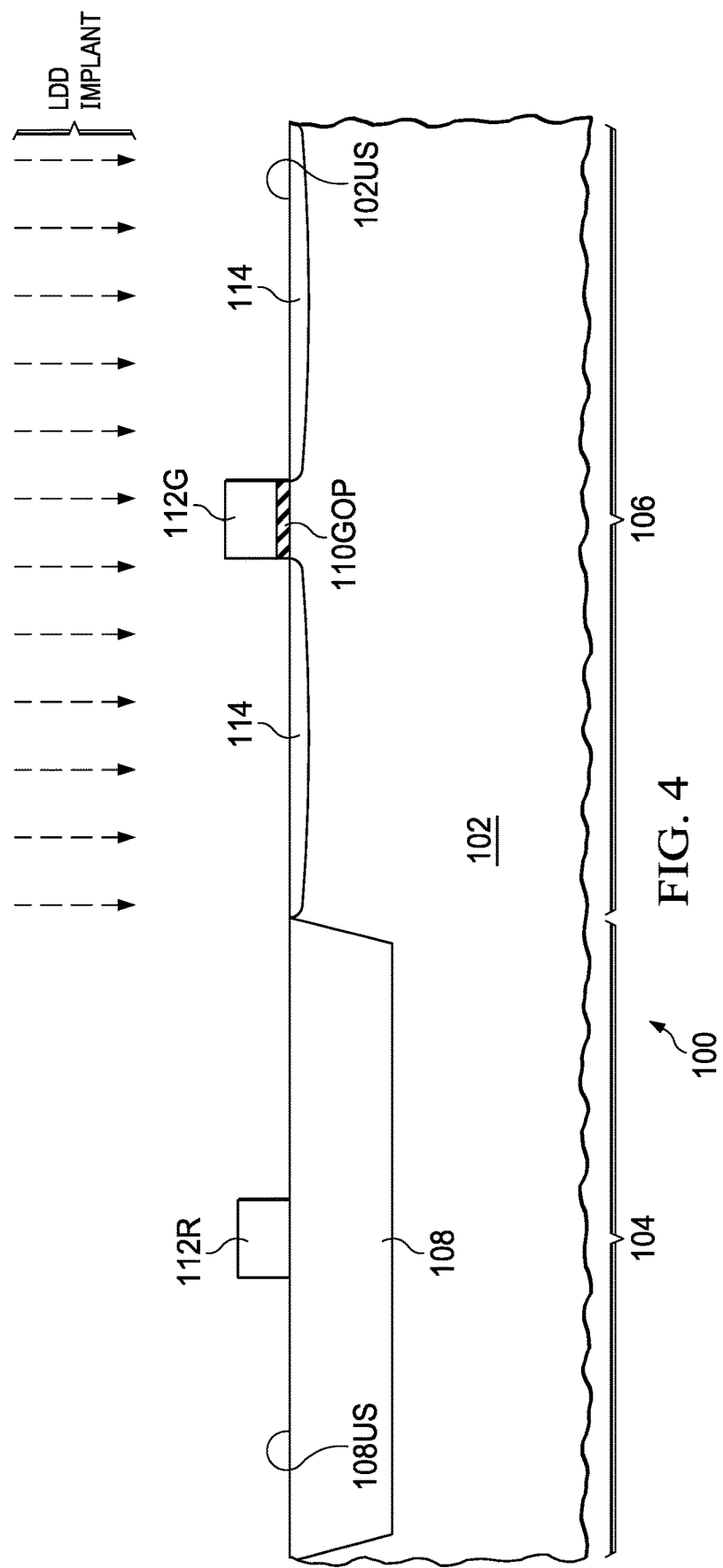

In FIG. 4 (and FIG. 11 method step 1108), a mask (not shown) is formed and patterned over the FIG. 3 polysilicon layer 112, and the polysilicon layer 112 is correspondingly etched so that only two portions of the polysilicon layer 112 remain, namely, a polysilicon resistor body portion 112R and a polysilicon gate portion 112G. Further, the polysilicon etch is continued to the upper surfaces 102US and 108US, thereby removing exposed portions of the FIG. 3 gate oxide layer 110, while leaving the unexposed portion of the oxide layer 110 beneath the polysilicon gate portion 112G, that oxide portion hereafter referred to as a gate oxide portion 110GOP. Thereafter, a relatively light dopant implant, commonly referred to as a lightly doped drain (LDD) implant, is performed, forming corresponding LDD regions 114 below the upper surface 102US and that self-align to the gate oxide portion 110GOP (and, at one end of the transistor 106, also self-aligning to a lateral edge of the surface isolation structure 108). The LDD implant provides, for example, an average dopant concentration of 1e18/cm$^3$ to 5e20/cm$^3$, and it is selected of a dopant type corresponding to the desired conductivity type of the transistor 106. For example, for an n-type metal oxide-semiconductor (NMOS) transistor, the LDD implant is of n-type dopants (and, alternatively, of complementary p-type for a PMOS transistor). During the LDD implant, the polysilicon resistor body portion 112R may or may not be masked, based on a desired outcome for the resistor 104. If the resistor body portion 112R is unmasked, ultimately the resistor 104 may have the same dopant type, as far as the majority of dopants is concerned, as the LDD implant, for example, if the LDD implant is n-type (sometimes referred to as NLDD), then the resistor 104 also may be n-type or, in complementary fashion, if the LDD implant is p-type (sometimes referred to as PLDD), then the resistor 104 also may be p-type. Alternatively, if the LDD implant is n-type, a later p-type implant also may be applied to the resistor body portion 112R, for example during the formation of p-type source/drain regions (sometimes referred to as PSD), so that the later PSD implant counterdopes the earlier NLDD implant, in which case the resultant resistor 104 has a relatively higher resistance, sometimes referred to as a high sheet-rho resistor (HSR). Alternative HSR examples also may be implemented with opposite doping types, namely, first a PLDD implant, followed later by an n-type (sometimes referred to as NSD) counterdoping.

Figure 5:
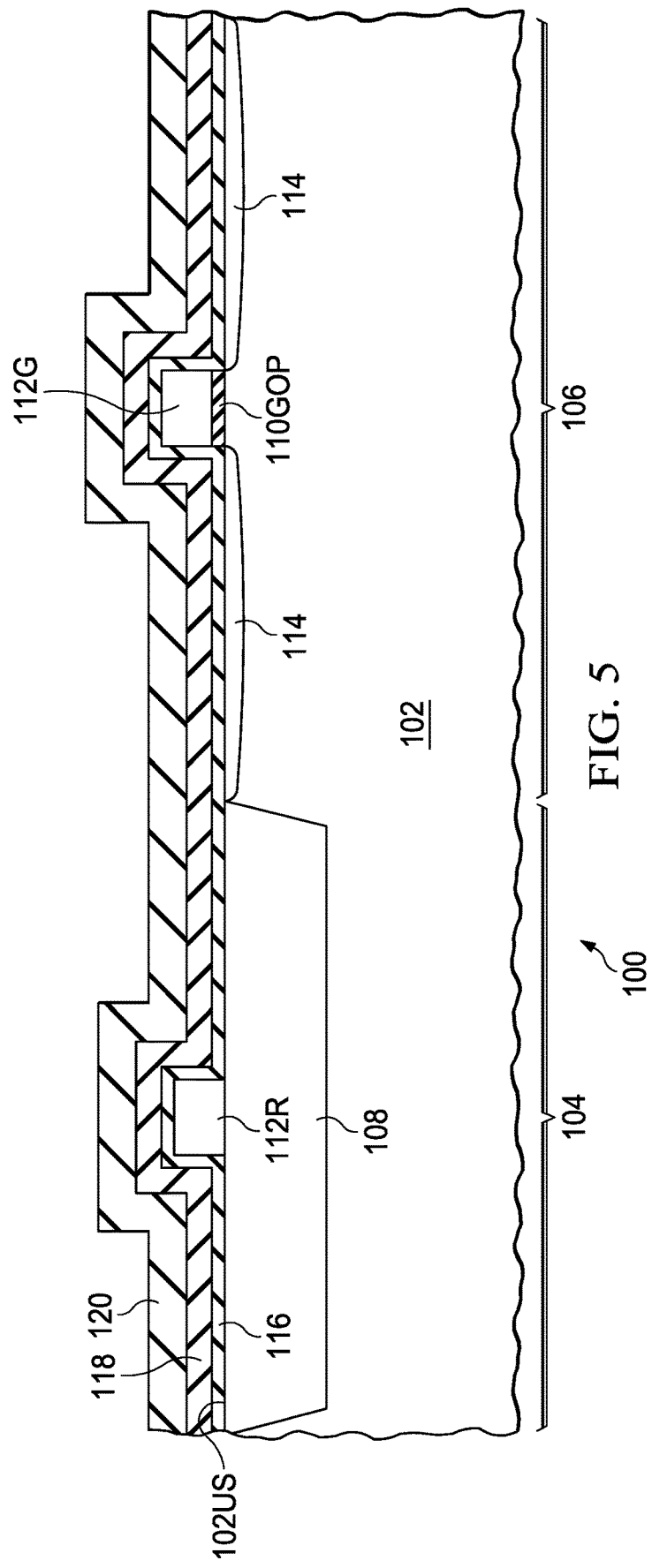

In FIG. 5 (and FIG. 11 method step 1110), multiple separate layers are formed over the FIG. 4 structure, in preparation to form alignment spacers in a later stage of manufacturing. In the illustrated example, there are three such layers. First, a first spacer oxide layer 116 is formed (e.g., deposited), for example having a thickness from 1 nm to 10 nm. Second, a spacer nitride layer 118 is formed (e.g., deposited as (bis-(tertiary butyl amino)-silane) (BTBAS)), for example having a thickness from 10 nm to 50 nm. Third, a second spacer oxide layer 120 is formed, (e.g., deposited), for example having a thickness from 10 nm to 60 nm. In an alternative example, the FIG. 6 multiple layers can include a different number of layers, for example with only two layers, by forming first an oxide layer and second a nitride layer.

Figure 6:
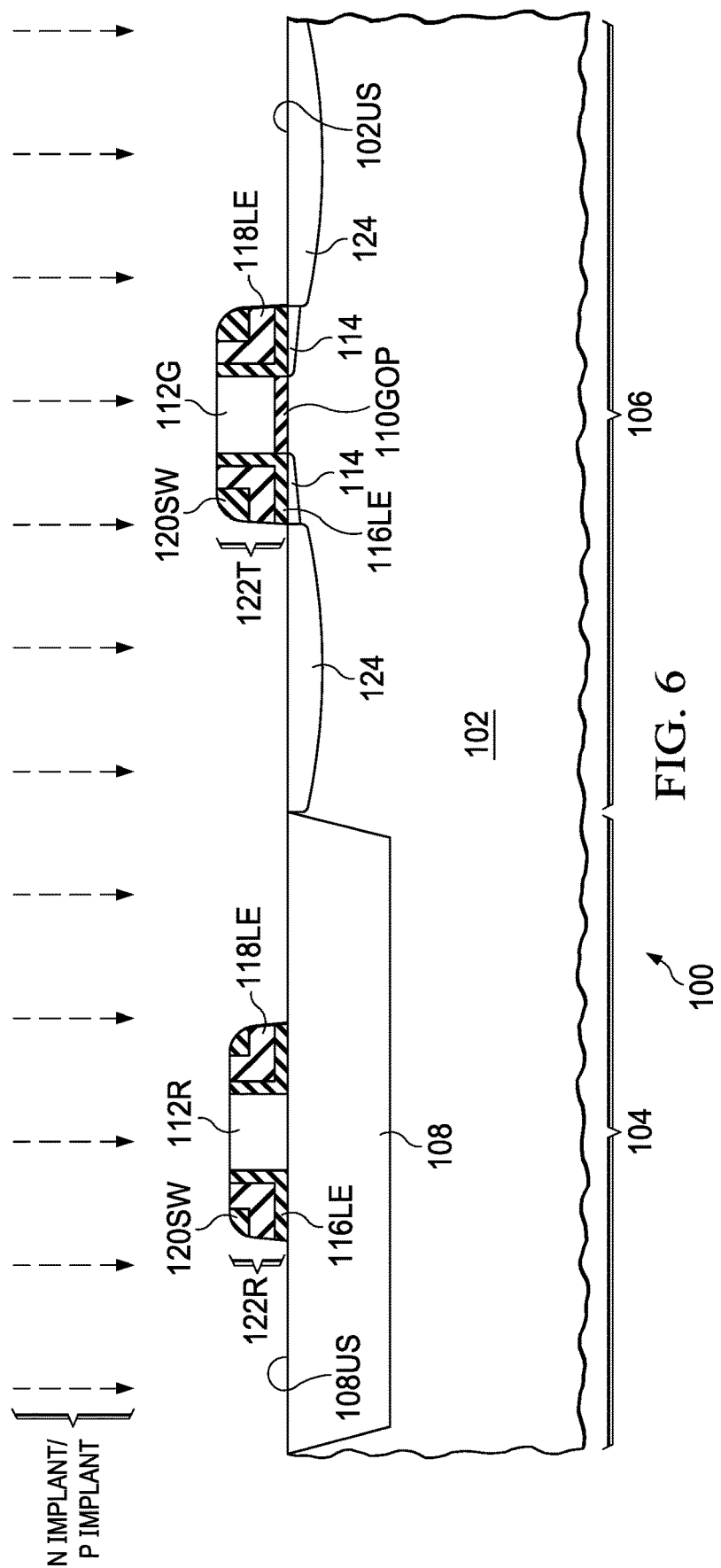

In FIG. 6 (and FIG. 11 method step 1112), the FIG. 5 three-layer combination (or two layer, in an alternative example), including the first spacer oxide layer 116, the spacer nitride layer 118, and the second spacer oxide layer 120, is patterned (mask not shown) and etched down to the upper surfaces 102US and 108US, thereby forming a respective spacer 122R for of the resistor 104 and a spacer 122T for the transistor 106. Each of the spacers 122R and 122T includes a portion of the first spacer oxide layer 116 and with a first lateral extension 116LE, a portion of the spacer nitride layer 118 and with a second lateral extension 118LE, and a portion of the second spacer oxide layer 120 that provides a spacer sidewall 120SW. Additionally, in one alternative example, the transistor sidewall (adjacent the gate sidewall) may include one or more additional layers (e.g., silicon oxide, offset nitride, cap oxide). In another alternative example as mentioned with FIG. 5, where only two layers (oxide then nitride) are formed to provide sidewall spacing, the two layers are etched to form a D-shaped sidewall spacer on each of the polysilicon resistor body portion 112R and a polysilicon gate portion 112G. In the illustrated example, after the spacer sidewall 120SW is formed, a source/drain dopant implant, at higher concentrations than the FIG. 4 LDD implant, is performed, forming corresponding transistor source/drain regions 124 below the upper surface 102US, mixing in part with the corresponding LDD regions 114, and that self-align to the spacers 122T (and, at one end of the transistor 106, also to the surface isolation structure 108). The source/drain implant provides, for example, an average dopant concentration of 1e19/cm$^3$ to 6e21/cm$^3$, and like the FIG. 4 LDD implant is selected of a dopant type corresponding to the desired conductivity type of the transistor 106, although the source/drain implant is at a higher energy and dose and forms dopant concentrations deeper below the upper surface 102US as compared to the LDD implant. Additionally, the implant, whether of n-type of p-type, also implants dopants into the polysilicon resistor body portion 1128, thereby affecting its conductivity, for example increasing the conductivity if a first dopant implant relative to undoped polysilicon or of the same type as the earlier LDD implant, or providing an HSR if counterdoping a prior LDD implant into the same polysilicon resistor body portion 112R.

Figure 7:
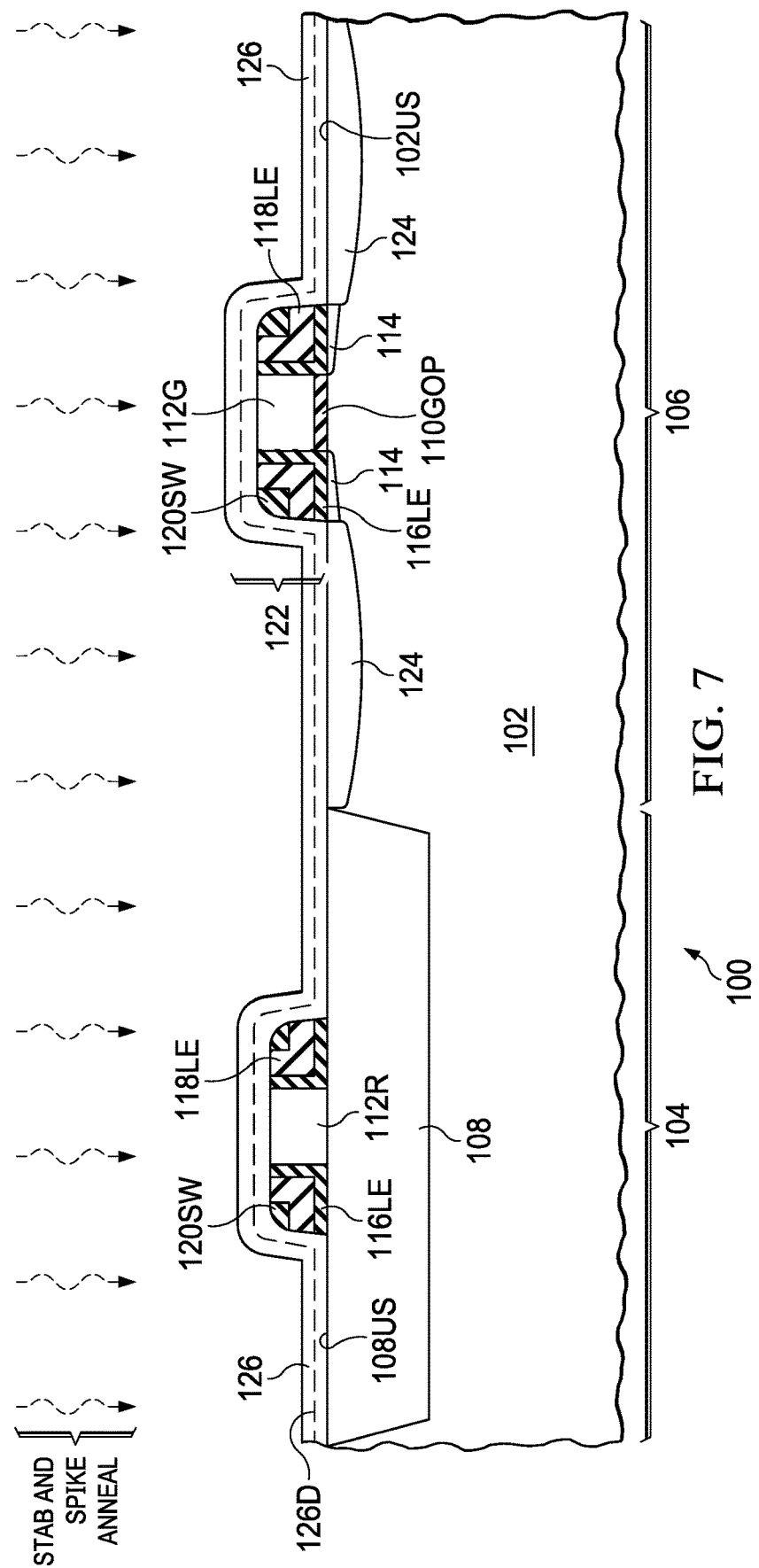

In FIG. 7 (and FIG. 11 method step 1114), first a conformal capping layer 126 is formed over the FIG. 6 structure. In a first example, the capping layer 126 may be high-tensile silicon oxide or nitride or carbide or a combination thereof, having a thickness from 10 nm to 100 nm. In a second example, and as shown in FIG. 7 by way of a dashed line 126D along the capping layer 126, the capping layer 126 may be a bi-layer, including first a thin oxide and second a stress memorization nitride (e.g., silicon-rich nitride). Second, a relatively long stabilization ("stab") anneal followed by a spike anneal are performed for the semiconductor structure 100. For example, the stab anneal can be at a stabilization temperature in a range from 500° C. to 600° C. for a period in a range from 20 s to 240 s. The stab anneal may improve cross-wafer (e.g., resistance) uniformity, for example in achieving a more uniform temperature distribution across the wafer. A spike anneal follows the stab anneal, the spike anneal rising to a spike peak temperature, for example, of 1,000° C. to 1,050° C., with a spike anneal ramp up time of approximately three seconds at a ramp up rate of approximately 170° C. per second, sometimes referred to as a refined spike anneal given the ramp rate exceeding 100° C. per second, and the spike peak temperature is followed by a ramp down of approximately 65° C. to 70° C. per second, for example to return to the stab temperatures or lower. The refined spike anneal accomplishes a stress memorization technique (SMT) for the semiconductor structure 100, namely, the stress from the capping layer 126 is transferred to and retained (memorized) in the polysilicon components beneath the conformal capping layer 126, such as the polysilicon resistor body portion 112R and a polysilicon gate portion 112G. In addition, the refined spike anneal also may activate implanted dopants, such as from FIGS. 4 and 6, and indeed the spike anneal may have a higher degree of activation from the higher peak temperature, thereby further reducing the resistance of the resistor 104 and in part assisting the resistor to achieve ZTCR performance, as further enhanced by an additional millisecond anneal described later, even without having previously provided a separate ZTCR mask and implant step. The stab and spike anneals also may improve consistency in resistance if plural resistors are formed as the resistor 104 or as between different resistors in different respective areas on the wafer that provides the substrate 102. The stab anneal immediately followed by the refined spike anneal may be referred to as a "stabilized spike anneal".

Figure 8:
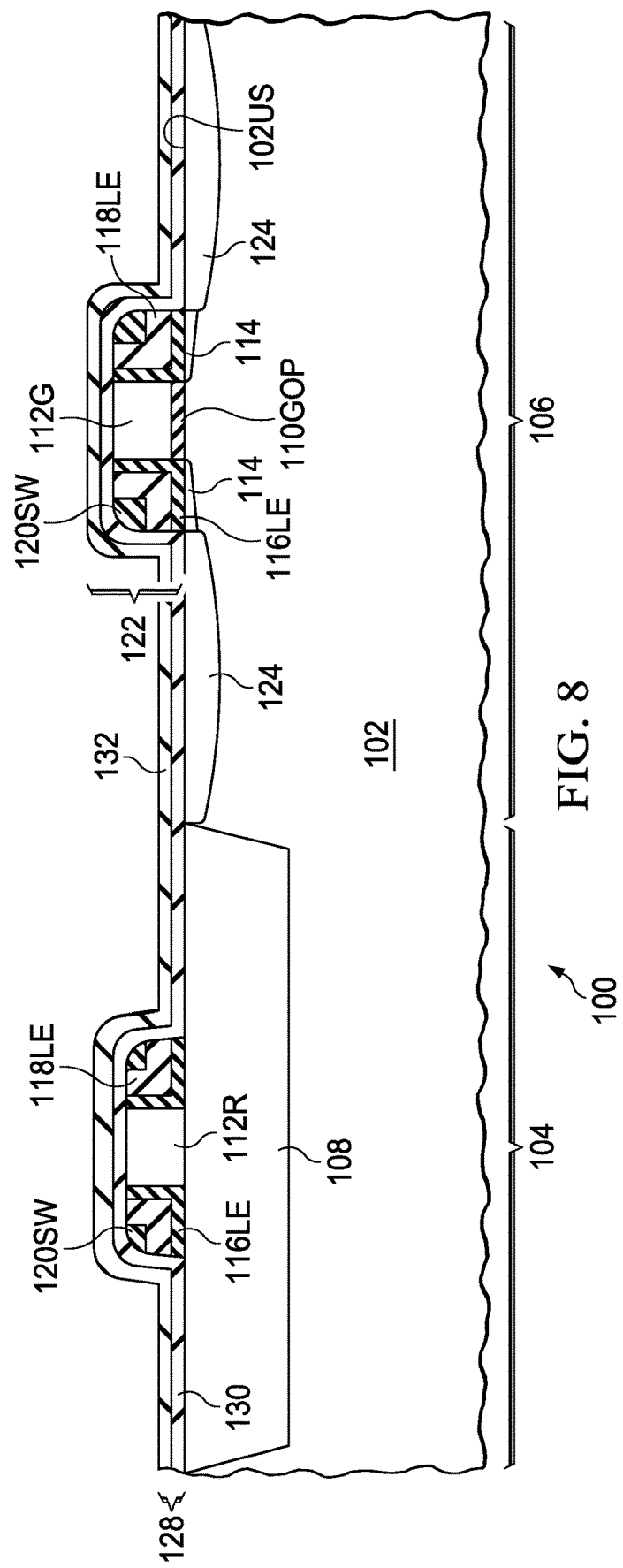

In FIG. 8 (and FIG. 11 method step 1116), the FIG. 7 capping layer 126, used to accomplish the SMT, is removed, either fully if a single layer of material, or the nitride portion may be removed, for example using hot phosphoric acid, if the capping layer 126 is bi-layer as mentioned as an alternative above. Thereafter, a multi-layer silicide block (SiBLK) stack 128 is formed, which in an example includes a SiBLK thin oxide layer 130 (which may remain as part of the prior-formed bi-layer using for the capping layer 126, thereby avoiding an additional formation/etch step) and a SiBLK thin nitride/carbide/SiCN layer 132. The SiBLK thin oxide layer 130 may be grown or deposited, and it has a thickness from 1 nm to 100 nm. The SiBLK thin nitride/carbide/SiCN layer 132 may be deposited by BTBAS for example at 550° C., or plasma enhanced chemical vapor deposition (PECVD) for example at 350° C. to 400° C., and with a thickness from 5 nm to 40 nm.

In FIG. 9 (and FIG. 11 method step 1118), a mask 134 is formed over the FIG. 7 SiBLK stack 128 in the area of the resistor 104, while no such mask is formed in the area of the transistor 106. Thereafter, a SiBLK etch is performed in the exposed areas other than as covered by the mask 134, and the etch stops at the SiBLK thin oxide layer 130 of the FIG. 8 SiBLK stack 128, such that the etch removes the exposed portions of the SiBLK thin nitride/carbide/SiCN layer 132. Accordingly, the polysilicon resistor body portion 112R remains covered by layers from the SiBLK stack 128, while the polysilicon gate portion 112G remains covered only by the oxide layer 130 of the SiBLK stack 128. Thereafter, the mask 134 (as shown later in FIG. 10) is removed and, as shown by the legend at the top of FIG. 9, a millisecond anneal is performed, for example at 1,200° C. to 1,350° C., and for a duration of less than one second, for example 1 ms to 100 ms. A millisecond anneal may be performed with various equipment alternatives, for example using a laser or flash lamp.

In FIG. 10 (and FIG. 11 method step 1120), the remaining exposed portion of the SiBLK layer 128 is removed, that is, the exposed SiBLK thin oxide layer 130. The oxide removal also removes the exposed spacer sidewall 120SW for the transistor 106, but does not for the resistor 104, since the spacer sidewall 120SW of the resistor 104 remains covered by a remaining portion of the SiBLK thin nitride/carbide/SiCN layer 132. Note that FIG. 10 also includes a millisecond anneal legend at its top, as an alternative example to indicate that the above-described millisecond anneal may occur after the SiBLK layer 128 is fully removed, as opposed to as indicated in FIG. 9 with it occurring once the SiBLK layer 128 is deposited, but not yet removed. Continuing in FIG. 10, a silicidation step is performed, thereby forming silicides on exposed semiconductor structures. Particularly, a gate silicide 136 is formed along an upper surface of the polysilicon gate portion 112G, and source/drain silicides 138 are formed along an upper surface of the transistor source/drain regions 124. Meanwhile, however, the remaining portion of the SiBLK structure 128, in the area of the resistor 104, prevents silicidation of the polysilicon resistor body portion 112R. Note also that FIG. 10, and the figures preceding it, show a cross-section that includes only a portion of the polysilicon resistor body portion 112R; as to other resistor portions, some may receive silicide as part of the FIG. 10 silicidation, for example at the resistor heads, or in the case of a serpentine resistor, at portions of the resistor turns, where any of those locations are left uncovered from the layers shown to mask the silicide of the polysilicon resistor body portion 112R in FIG. 10.

Completing FIG. 11 but without corresponding cross-section views, additional steps in manufacturing the semiconductor structure 100 are contemplated. For example, in a step 1122, portions of which may have been performed earlier in the method 1100, one or more additional semiconductor features are formed on or in a layer(s) of the semiconductor substrate 102, with like copies of each feature formed into each respective IC on the semiconductor wafer that includes the semiconductor substrate 102. The step 1122 of forming the one or more additional semiconductor features may include almost any process used to form any feature. For example, the step 1122 might include patterning one or more photoresist features on or in connection with the semiconductor substrate 102, including in connection with various layers and levels. Additionally, the step 1122 might include forming one or more interconnect features. The step 1122 also may include other process steps, or a collection of different process steps, so that eventually all features for functional operation of the semiconductor structure 100 are complete.

Next, in a step 1124, the semiconductor wafer including the semiconductor substrate 102 may be coupled to test equipment and tested, after which each IC is cut (diced) from the semiconductor wafer. Thereafter, some or all of the ICs (e.g., those passing testing) are packaged. Packaging typically places a casing around (or encapsulating) the IC and further provides an external interface, typically a number of conductive pins, fixed relative to pads on the die, and conductors such as wire bonds, lands, or balls, are formed between the IC pads and the packaging pins. Thereafter, any packaged IC with an acceptable test result is ready for sale and shipping to a customer.

Figure 12:
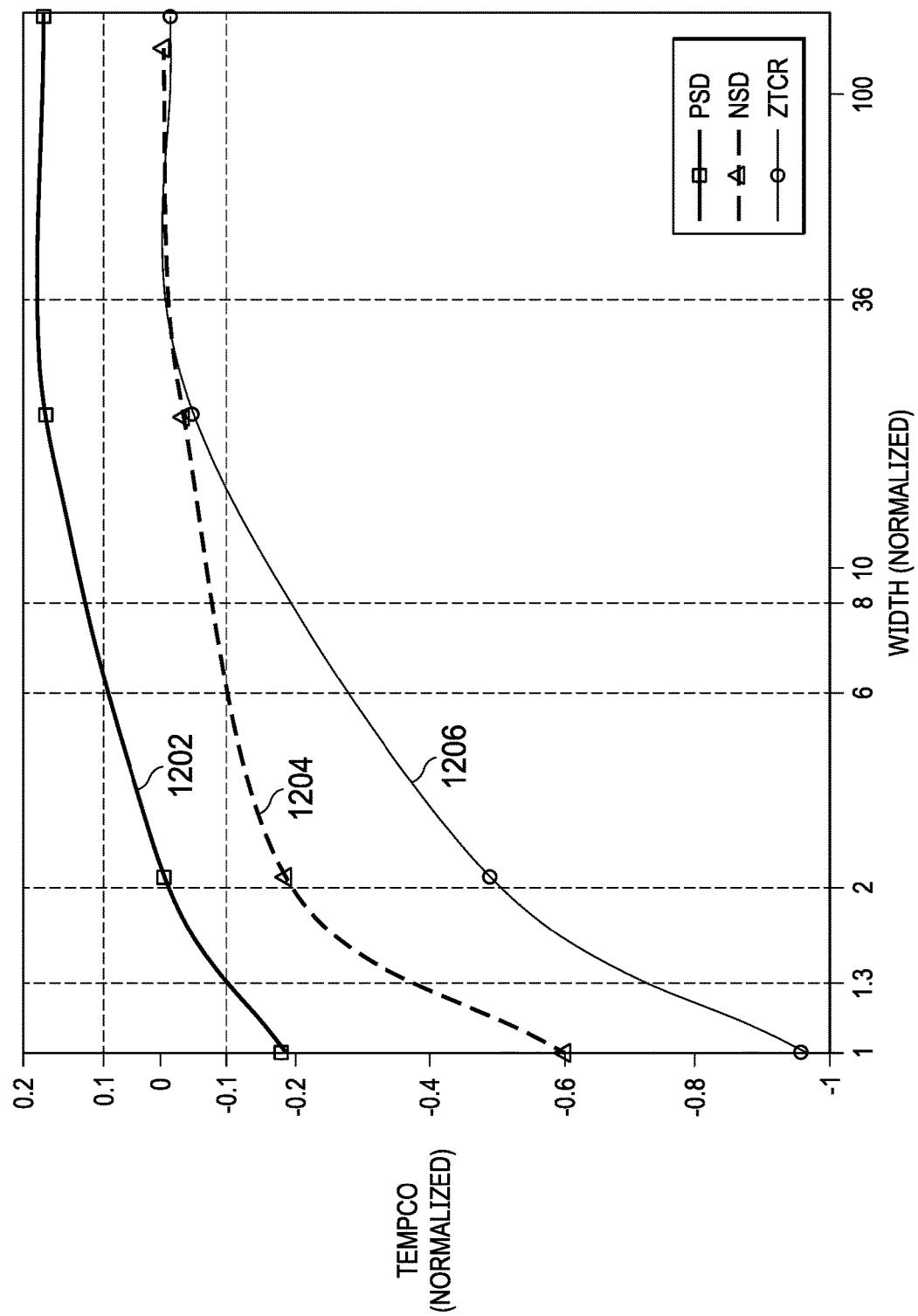
FIG. 12 is a resistance plot for three resistor types, including those manufactured by the FIG. 11 method.

FIG. 12 is a resistance graph 1200, for three resistor types, including the two manufactured by the FIG. 11 method. The graph 1200 includes normalized resistor size (e.g., resistor line width, for example in nanometers up to microns) on the horizontal axis and in logarithmic scale, and it includes normalized tempco, that is resistor temperature-variable resistance, on the vertical axis (e.g., parts per million per ° C.). The graph 1200 includes plots for three resistor types, including two manufactured as the resistor 104 by the FIG. 11 example method 1100, namely, a PSD resistor resistance plot 1202 and an NSD resistor resistance plot 1204. The graph 1200 also includes a ZTCR resistance plot 1206, representative of temperature variable resistance of a ZTCR, as may be constructed using prior technologies.

For each of the three plots 1202, 1204, and 1206, the temperature-based performance of the resistor can be evaluated as each plot approaches, or is within some range, of zero, where the closer the resistance is to zero or within some relatively small range of zero, the better the resistor qualifies as a zero tempco resistor. Further, a resistor still may be usable for zero tempco (or near-zero tempco) performance if it falls within an application-appropriate tempco range. For example, consider the range ±0.2 for normalized tempco, which could correspond for example to an actual range of ±100 ppm/° C. In this range, a ZTCR resistor having a normalized width of at least approximately 8 has a −0.2 normalized tempco, and that tempco approaches zero for larger widths (reaching zero at an approximate normalized width of 36). In contrast, for a PSD resistor 104 constructed per method 1100, it reaches the same −0.2 normalized tempco at a considerably smaller width as compared to the ZTCR, that is, the PSD resistor achieves this tempco at a normalized width approximately 1.0 and other PSD resistors remain within the range ±0.2 normalized tempco until at least a normalized width of 100. Similarly, for an NSD resistor 104 constructed per method 1100, it reaches the same normalized tempco of −0.2 at a normalized width of approximately 2.0, and other NSD resistors also remain within the ±0.2 normalized tempco range until at least a normalized width of 100. Accordingly, an IC may be constructed using method 1100 to implement one or both of PSD and NSD resistors with these attributes. Some of the preceding observations occur also for a narrower tempco range. For example, consider a ±0.1 normalized tempco range, which could correspond for example to an actual range of ±50 ppm/° C. In this range, the PSD resistor resistance plot 1202 illustrates achieving the range at a normalized width of approximately 1.3 up to approximately 6.0, while the NSD resistor resistance plot 1202 illustrates achieving the range at a normalized width of approximately 6.0 or greater.

Accordingly, while the above-described examples provide a method 1100 that constructs resistors and/or transistors with favorable efficiency (e.g., number and ordering of steps plus reducing cost), an additional and unexpected outcome is that method 1100 provides a choice of one or both types of resistors, each with favorable tempco (or near tempco) performance, with both the PSD and NSD resistors approaching zero tempco at a width less than that of traditional ZTCR resistors. Accordingly, a designer can achieve ZTCR performance or better, using NSD or PSD resistors at smaller widths. Still further, a designer may choose to implement both the PSD and NSD resistors in a single IC, for example using the PSD resistor(s) where relatively smaller width is desired or required and using the NSD resistor(s) where relatively larger width is desired or required From the above, one skilled in the art should appreciate that examples are provided for semiconductor IC fabrication, for example with respect to an IC that includes both polysilicon resistors and transistors. Such examples provide various benefits, some of which are described above and including still others. Examples are formed using a resistor SiBLK structure formation relatively late in the manufacturing steps, preferably after transistor source/drain implants, whereby the transistor source/drain implants may concurrently implant dopants into the resistor body. Accordingly, the source/drain implant to the resistor body, particularly with a subsequent anneal, can improve performance relative to other ZTCR approaches, while reducing or eliminating the need for separate, and earlier in the process, ZTCR masking and implanting steps. Further, examples include a millisecond anneal after the SiBLK is deposited, and either before or after it is removed, and in either case the millisecond anneal can both anneal out potential damage from the SiBLK formation as well as reactivate dopants that are potentially deactivated by the SiBLK formation which can thereby lower the resistor conductivity and make the tempco negative. Another example contemplates that ZTCR (or better) metrics may be achieved with either p-type or n-type dopants and, indeed, one or the other dopant type can correspond to zero tempco performance for different width-sized resistors, that is, p-type doped resistors may have zero tempco for a first size range, while n-type doped resistors may have zero tempco for a second size range that differs from the first size range. Accordingly, an IC may be implemented with selectability of an appropriate dopant type for ZTCR zero tempco polysilicon resistors according to size considerations for the IC. Still another example implemented as n-type polysilicon resistors are contemplated to provide very low drift, comparable to baseline ZTCRs. Yet another example implemented as p-type polysilicon resistors are contemplated to provide matching that is comparable to, or exceeding that of, baseline ZTCRs. These benefits may be realized for more complex structures, of for multiple devices on the same substrate (and IC), thereby realizing scaled improvement across the device. Still additional modifications are possible in the described examples, and other examples are possible, within the scope of the following claims.

What is claimed is:

1. A method of forming an integrated circuit, comprising:
   first, forming a resistor body and a transistor gate from a semiconductor layer;
   second, forming sidewall spacers adjacent the resistor body and the transistor gate;
   third, performing a stabilized spike anneal including maintaining a temperature in a range from 500° C. to 600° C. for a period in a range from 20 s to 240 s, then increasing the temperature at a rate exceeding 100° C. per second;
   fourth, forming a silicide blocking structure over at least a portion of the resistor body; and
   fifth, concurrently millisecond annealing the resistor body and the transistor gate.

2. The method of claim 1:
   wherein the step of forming a silicide blocking structure includes depositing a silicide block material; and
   wherein the step of concurrently millisecond annealing occurs while at least a portion of the silicide block material covers the transistor gate.

3. The method of claim 1:
   wherein the step of forming a silicide blocking structure includes depositing a silicide block material; and
   wherein the step of concurrently millisecond annealing occurs after an entirety of the silicide block material is removed from the transistor gate.

4. The method of claim 1 wherein the millisecond annealing step includes laser annealing.

5. The method of claim 1 wherein the millisecond annealing step includes flash lamp annealing.

6. The method of claim 1 wherein the millisecond annealing step includes annealing at a temperature of at least 1,000° C. and for a duration of less than one second.

7. The method of claim 1 further comprising concurrently implanting dopants into the resistor body and into source/drain regions adjacent the transistor gate.

8. The method of claim 7 and further including, after the concurrently implanting step and before the fourth step, annealing the source/drain regions.

9. The method of claim 8 wherein the step of annealing the source/drain regions includes performing the stabilization spike anneal by a process which includes performing a stabilization anneal at a first temperature and for a first duration followed by performing a spike anneal at a second temperature greater than the first temperature and for a second duration lesser than the first duration.

10. The method of claim 8 and further including, prior to annealing the source/drain regions, forming a stress memorization capping layer in a fixed position relative to the transistor gate.

11. The method of claim 10 and further including, after forming the stress memorization capping layer, and before the third fourth step, removing the stress memorization capping layer.

12. A method of forming an integrated circuit, comprising:
forming a resistor body relative to a semiconductor substrate;
forming a transistor gate relative to the semiconductor substrate;
forming a first source/drain region and a second source/drain region in a fixed position relative to the transistor gate, including a first implant with a first dopant dose and a second implant with a greater second dopant dose;
after forming the first source/drain region and the second source/drain region, forming a silicide blocking structure over at least a portion of the resistor body;
after forming the silicide blocking structure, millisecond annealing the first source/drain region and the second source/drain region; and
before forming the silicide blocking structure, performing a stabilization anneal including maintaining a stabilization temperature in a range from 500° C. to 600° C. for a period in a range from 20 s to 240 s, then performing a spike anneal including ramping the semiconductor substrate temperature from the stabilization temperature to a spike peak temperature at a ramp rate exceeding 100° C. per second.

13. The method of claim 12 and further including removing the silicide block structure before the millisecond annealing.

14. The method of claim 12 and further including forming a sidewall spacer on a sidewall of the resistor body, wherein the silicide blocking structure touches a silicon oxide spacer sidewall and a silicon oxide lateral extension of the sidewall spacer.

15. The method of claim 1, wherein the stabilized spike anneal comprises a stabilization anneal portion and a spike anneal portion.

16. The method of claim 15, wherein the spike anneal portion comprises ramping a substrate temperature from a stabilization temperature to a spike peak temperature at a ramp rate exceeding 100° C. per second.

17. A method of forming an integrated circuit, comprising:
forming a polysilicon resistor body portion and a polysilicon gate portion over a semiconductor substrate;
forming a capping layer over the polysilicon resistor body portion and the polysilicon gate portion, the capping layer including a first layer and a second layer;
performing a stress memorization process including:
maintaining a temperature of the semiconductor substrate in a range from 500° C. to 600° C. for a period in a range from 20 s to 240 s; and
then increasing the temperature at a rate exceeding 100° C. per second to a spike peak temperature;
removing the second layer of the capping layer after the stress memorization process;
forming a silicide blocking structure by depositing a third layer on the first layer of the capping layer and patterning the first and third layers.

18. The method of claim 17, wherein:
the first layer comprises an oxide layer;
the second layer comprises a nitride layer; and
the third layer comprises one of a nitride layer, a carbide layer, and a silicon carbon nitride (SiCN) layer.

19. The method of claim 17, wherein patterning the first and third layers comprises concurrently patterning the first and third layers to form the silicide blocking structure over the polysilicon resistor body portion.

* * * * *